US010748768B2

(12) United States Patent
Lin et al.

(10) Patent No.: US 10,748,768 B2
(45) Date of Patent: Aug. 18, 2020

(54) METHOD FOR MANDREL AND SPACER PATTERNING

(71) Applicant: Taiwan Semiconductor Manufacturing Co., Ltd., Hsin-Chu (TW)

(72) Inventors: Yu Chao Lin, Hsinchu (TW); Chao-Cheng Chen, Hsin-Chu (TW); Chun-Hung Lee, Hsinchu (TW); Yu-Lung Yang, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/217,167

(22) Filed: Dec. 12, 2018

(65) Prior Publication Data
US 2019/0122888 A1 Apr. 25, 2019

Related U.S. Application Data

(63) Continuation of application No. 15/096,541, filed on Apr. 12, 2016, now Pat. No. 10,157,742.
(Continued)

(51) Int. Cl.
*H01L 21/033* (2006.01)
*H01L 21/308* (2006.01)
(Continued)

(52) U.S. Cl.
CPC ...... *H01L 21/0338* (2013.01); *H01L 21/0335* (2013.01); *H01L 21/0337* (2013.01);
(Continued)

(58) Field of Classification Search
CPC .......... H01L 21/02326; H01L 21/0234; H01L 21/0335; H01L 21/0337; H01L 21/0338;
(Continued)

(56) References Cited

U.S. PATENT DOCUMENTS 5,328,810 A 7/1994 Lowrey et al.
5,489,548 A 2/1996 Nishioka et al.
(Continued)

FOREIGN PATENT DOCUMENTS

CN 1619788 A 5/2005
CN 101044595 A 9/2007
(Continued)

OTHER PUBLICATIONS

Felicia Goh et al., "Challenges in Sub-Micron Contact Hole Cleaning," ECS Transactions, 11 (2), pp. 267-274 (2007), The Electrochemical Society.
(Continued)

*Primary Examiner* — Lan Vinh
(74) *Attorney, Agent, or Firm* — Haynes and Boone, LLP

(57) ABSTRACT

A method includes forming mandrel patterns over a substrate; depositing a spacer layer over the mandrel patterns and onto sidewalls of the mandrel patterns; trimming the spacer layer to reduce a thickness of the spacer layer along a pattern width direction; and etching the spacer layer to expose the mandrel patterns, resulting in a patterned spacer layer on the sidewalls of the mandrel patterns. The trimming of the spacer layer and the etching of the spacer layer are performed in separate processes. After the trimming of the spacer layer and the etching of the spacer layer, the method further includes removing the mandrel patterns.

20 Claims, 20 Drawing Sheets

Related U.S. Application Data

(60) Provisional application No. 62/273,554, filed on Dec. 31, 2015.

(51) Int. Cl.
*H01L 21/311* (2006.01)
*H01L 21/3213* (2006.01)
*H01L 21/3065* (2006.01)
*H01L 21/02* (2006.01)

(52) U.S. Cl.
CPC .... *H01L 21/3086* (2013.01); *H01L 21/31144* (2013.01); *H01L 21/32139* (2013.01); *H01L 21/0234* (2013.01); *H01L 21/02326* (2013.01); *H01L 21/30655* (2013.01); *H01L 21/31116* (2013.01)

(58) Field of Classification Search
CPC ........... H01L 21/30655; H01L 21/3086; H01L 21/31116; H01L 21/31144; H01L 21/32139
USPC ....... 438/638, 639, 706, 710, 712, 714, 717, 438/723, 736, 719, 725, 738
See application file for complete search history.

(56) References Cited

U.S. PATENT DOCUMENTS

| | | | |
|---|---|---|---|
| 6,472,283 | B1 | 10/2002 | Ishida et al. |
| 7,179,245 | B2 | 2/2007 | Giori |
| 7,250,114 | B2 | 7/2007 | Kiehlbauch et al. |
| 7,670,914 | B2 | 3/2010 | Krivokapic |
| 7,776,744 | B2 | 8/2010 | Sandhu et al. |
| 8,039,179 | B2 | 10/2011 | Shieh et al. |
| 8,043,921 | B2 | 10/2011 | Kirkpatrick et al. |
| 8,168,375 | B2 | 5/2012 | Nakajima et al. |
| 8,202,681 | B2 | 6/2012 | Lin et al. |
| 8,728,332 | B2 | 5/2014 | Lin et al. |
| 8,822,243 | B2 | 9/2014 | Yan et al. |
| 8,906,757 | B2 | 12/2014 | Kim et al. |
| 9,129,814 | B2 | 9/2015 | Tung et al. |
| 9,245,766 | B2 | 1/2016 | Wang et al. |
| 2005/0170659 | A1 | 8/2005 | Hanafi et al. |
| 2006/0091468 | A1 | 5/2006 | Liaw |
| 2010/0130010 | A1 | 5/2010 | Park et al. |
| 2010/0330498 | A1 | 12/2010 | Bae et al. |
| 2011/0104901 | A1* | 5/2011 | Yatsuda ............... H01L 21/0337 438/703 |
| 2011/0130006 | A1* | 6/2011 | Abatchev ............ H01L 21/0337 438/703 |
| 2011/0256727 | A1 | 10/2011 | Beynet et al. |
| 2011/0281208 | A1 | 11/2011 | Lin et al. |
| 2012/0278776 | A1 | 11/2012 | Lei et al. |
| 2012/0291952 | A1 | 11/2012 | Davis et al. |
| 2013/0023120 | A1* | 1/2013 | Yaegashi ........... H01J 37/32091 438/689 |
| 2013/0228862 | A1* | 9/2013 | Lee ................. H01L 21/823807 257/347 |
| 2013/0295769 | A1 | 11/2013 | Lin et al. |
| 2013/0320451 | A1 | 12/2013 | Liu et al. |
| 2014/0193974 | A1 | 7/2014 | Lee et al. |
| 2014/0215421 | A1 | 7/2014 | Chen et al. |
| 2014/0242794 | A1 | 8/2014 | Lin et al. |
| 2014/0264760 | A1 | 9/2014 | Chang et al. |
| 2014/0264899 | A1 | 9/2014 | Chang et al. |
| 2014/0273442 | A1 | 9/2014 | Liu et al. |
| 2014/0273446 | A1 | 9/2014 | Huang et al. |
| 2015/0147886 | A1* | 5/2015 | Tung ....................... C23G 1/02 438/696 |
| 2015/0280114 | A1* | 10/2015 | Shen ...................... H01L 43/12 438/3 |
| 2016/0071730 | A1 | 3/2016 | Tung et al. |

FOREIGN PATENT DOCUMENTS

| | | |
|---|---|---|
| CN | 101963755 A | 2/2011 |
| CN | 102822943 A | 12/2012 |
| CN | 104658892 A | 5/2015 |
| CN | 104658980 A | 5/2015 |
| CN | 106935484 A | 7/2017 |
| JP | 2008511991 | 4/2008 |
| JP | 4822077 | 11/2011 |
| KR | 20090090327 | 8/2009 |
| KR | 20110002796 | 1/2011 |

OTHER PUBLICATIONS

Xiaomin Yang et al., "Electron-Beam Lithography Method for Sub-50-nm Isolated Trench with High Aspect Ratio," The Smithsonian/NASA Astrophysics Data System Emerging Lithographic Technologies VII, Edited by Engelstad, Roxann L. Proceedings of the SPIE, vol. 5037, pp. 168-177 (11 pages), 2003.

* cited by examiner

METHOD FOR MANDREL AND SPACER PATTERNING

This is a continuation application of U.S. patent application Ser. No. 15/096,541, filed Apr. 12, 2016, which is a non-provisional application of and claims the benefits of U.S. Provisional Patent Application Ser. No. 62/273,554, filed Dec. 31, 2015. Both applications are hereby incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, traditional photolithography alone can no longer meet the requirements for critical dimension (CD) and pattern density in advanced process nodes, such as 20 nanometer (nm) or smaller. Frequently, a mandrel-spacer technique is used for doubling the exposed pattern in advanced photolithography. A typical mandrel-spacer technique forms mandrel patterns in a first exposure, and forms spacer features on sidewalls of the mandrel patterns. Subsequently, it removes the mandrel patterns and uses the spacer features as an etch mask for forming a final pattern. This technique effectively reduces the pitch of the final pattern by half compared with the first exposed pattern.

However, it is challenging for typical mandrel-spacer techniques to produce both uniform pitches and uniform CDs simultaneously in the final pattern.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
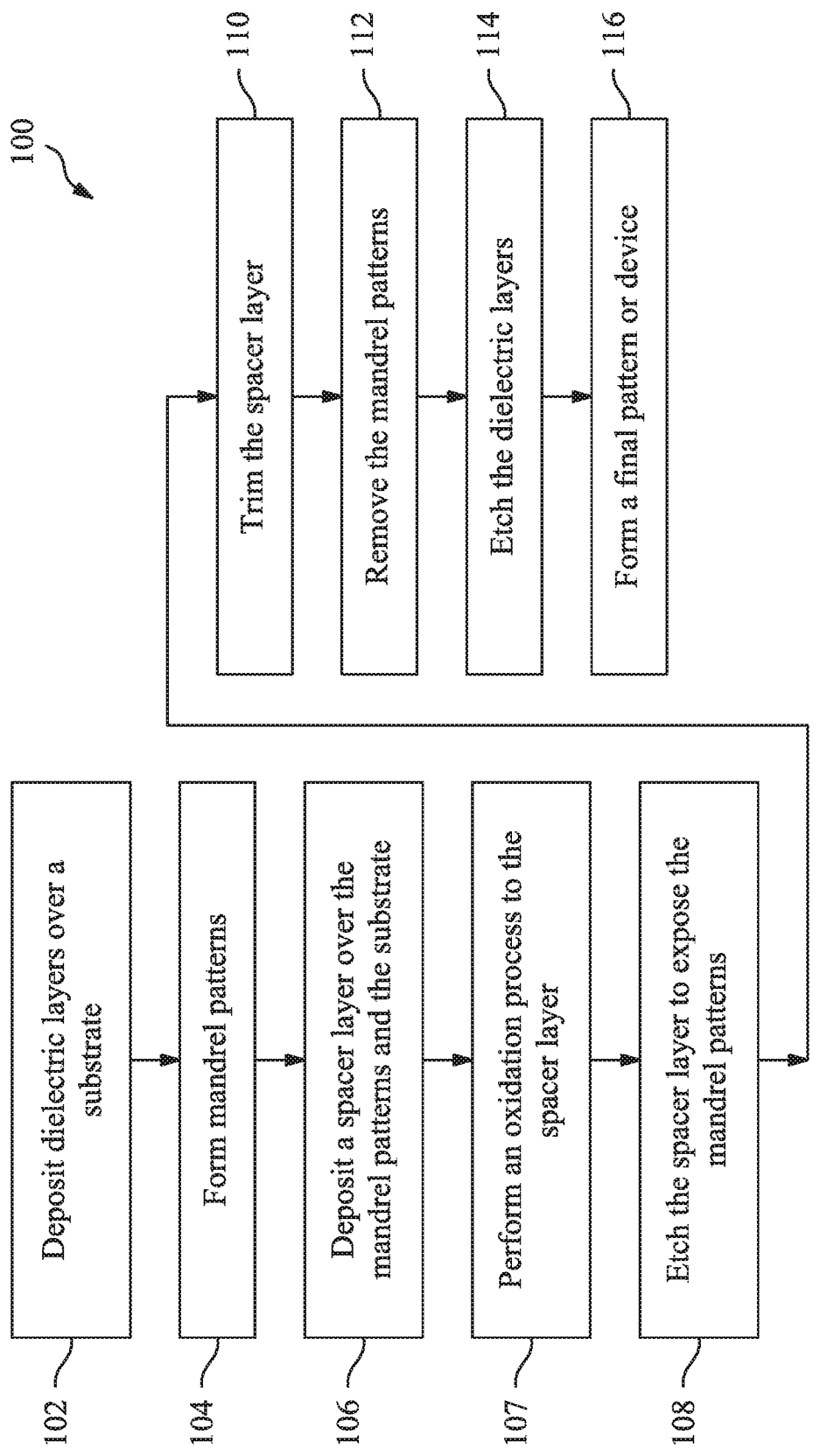
FIG. 1 illustrates a flowchart of a method of patterning a substrate according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods of forming semiconductor devices. More particularly, the present disclosure is related to forming semiconductor devices using mandrel-spacer patterning techniques. The mandrel-spacer patterning techniques include self-aligned double patterning (SADP) process, which reduces the pitch of the exposed pattern by half; self-aligned quadruple patterning (SAQP) process, which reduces the pitch of the exposed pattern by a quarter; and other spacer patterning processes. According to some embodiments of the present disclosure, spacer features are trimmed before mandrel patterns are removed (termed a "trim-first" process). Therefore, each spacer feature is trimmed on one side thereof. The trimming of the spacer features ensures spacing between adjacent spacer features substantially matches a dimension (width) of the respective mandrel patterns. Since a final pattern's pitch and CD are related to both the spacing between adjacent spacer features and the width of the mandrel patterns, the trimming of the spacer features helps improve both the CD uniformity and the pitch uniformity in the final pattern.

FIG. 1 is a high-level flowchart of a method 100 of manufacturing an IC device 200 according to various aspects of the present disclosure. The method 100 is merely an example for illustrating various aspects of the provided subject matter. Additional operations can be provided before, during, and after the method 100, and some operations described can be replaced, eliminated, merged, or relocated for additional embodiments of the method. The various operations in FIG. 1 are discussed below in conjunction with FIGS. 2A-2J which illustrate cross-sectional views of a device 200 at various fabrication stage of an embodiment of the method 100. The device 200 may be included in an IC such as a microprocessor, memory device, and/or other IC which may comprise passive components such as resistors, capacitors, and inductors, and active components such as p-type field effect transistors (PFET), n-type FET (NFET), metal-oxide semiconductor field effect transistors (MOSFET), complementary metal-oxide semiconductor (CMOS) transistors, bipolar transistors, high voltage transistors, high frequency transistors, multi-gate FETs including FinFETs, and combinations thereof.

Figure 2A:
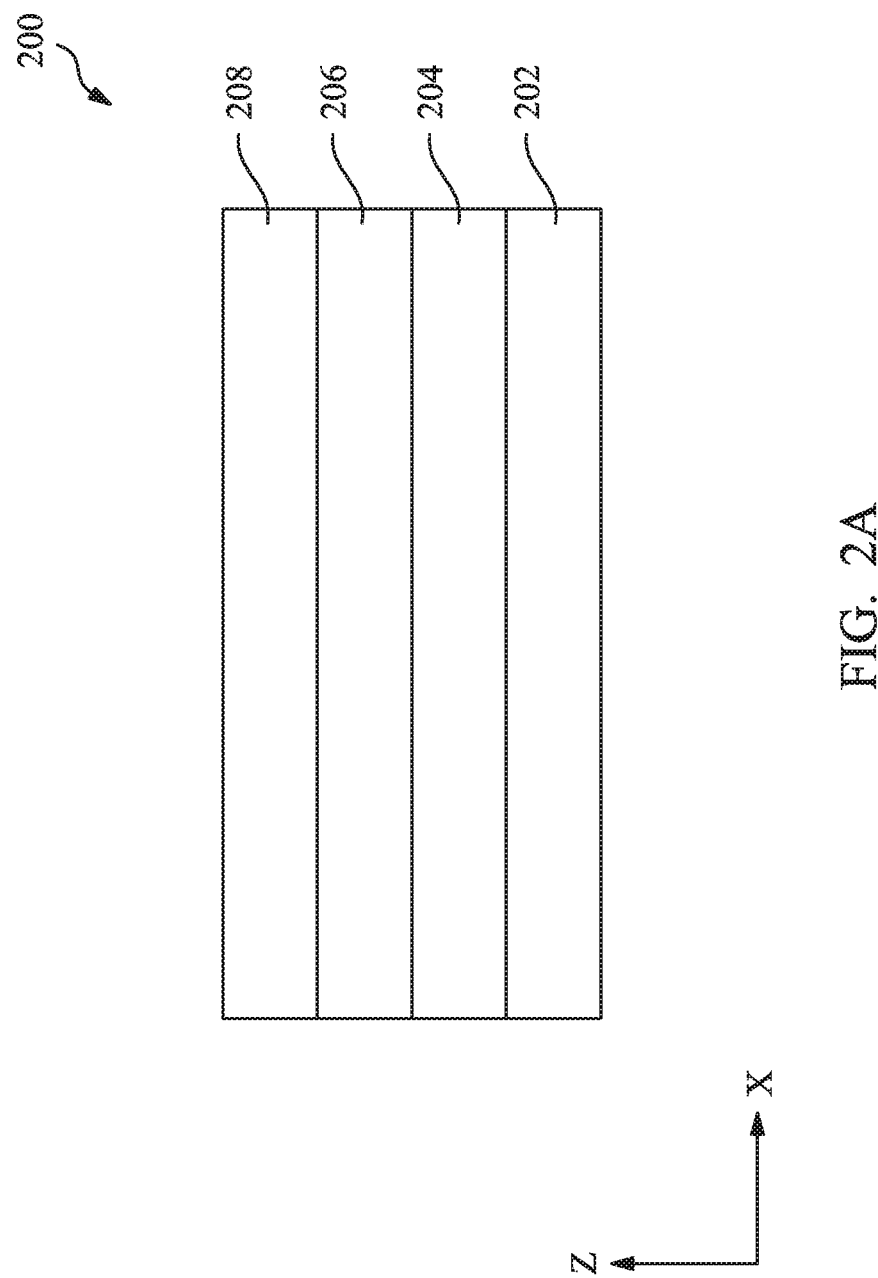
FIGS. 2A, 2B, 2C, 2D, 2E, 2F, 2G, 2H, 2I, and 2J illustrate cross-sectional views of a device in various manufacturing steps of the method in FIG. 1, in accordance with some embodiments.

At operation 102, the method 100 (FIG. 1) deposits dielectric layers over a substrate 202 (FIG. 2A) in preparation for patterning the substrate 202 and forming the IC device 200 thereon and/or therein. Referring to FIG. 2A, exemplary dielectric layers 204, 206, and 208 are deposited over the substrate 202. The substrate 202 includes silicon in the present embodiment, such as a semiconductor wafer. In various embodiments, the substrate 202 may include another elementary semiconductor, such as germanium; a compound semiconductor such as silicon carbide, gallium arsenide, gallium phosphide, indium phosphide, indium arsenide, and/or indium antimonide; an alloy semiconductor such as GaAsP, AlInAs, AlGaAs, InGaAs, GaInP, and/or GaInAsP, or combinations thereof. The substrate 202 may include active regions, epitaxial features, isolation structures, fin-like semiconductor regions, and/or other suitable features. In the present embodiment, the substrate 202 includes a polysilicon layer, which may be used for forming polysilicon gate electrodes or for forming dummy gate electrodes in a gate-replacement process. In an embodiment, the polysilicon layer may have a thickness about 1000 angstrom (Å).

Materials suitable for the dielectric layers 204, 206, and 208 include, but not limited to, silicon oxide, plasma enhanced silicon oxide (PEOX), silicon nitride, polysilicon, doped polysilicon, silicon oxynitride, tetraethyl orthosilicate (TEOS), nitrogen-containing oxide, nitride oxide, high-k dielectric materials, low-k dielectric materials, or combinations thereof. In an embodiment, the dielectric layer 204 is a silicon nitride layer having a thickness about 100 Å, the dielectric layer 206 is a silicon oxide layer having a thickness about 1200 Å, and the dielectric layer 208 is a polysilicon layer having a thickness about 1000 Å. The dielectric layers 204, 206, and 208 may each be formed by one or more deposition techniques, such as thermal oxidation, chemical vapor deposition (CVD), physical vapor deposition (PVD), plasma-enhanced CVD (PECVD), and atomic layer deposition (ALD). The dielectric layers 204 and 206 are used for patterning the substrate 202. Therefore, they are also referred to as patterning layers 204 and 206 respectively. In various embodiments, other dielectric layers may be formed over the substrate 202 and used for the purposes of patterning the substrate 202. The other dielectric layers may be disposed between, above, or below the dielectric layers 204 and 206. In an embodiment, one or both of the layers 204 and 206 may be omitted if the substrate 202 includes a patterning layer therein.

Figure 2B:
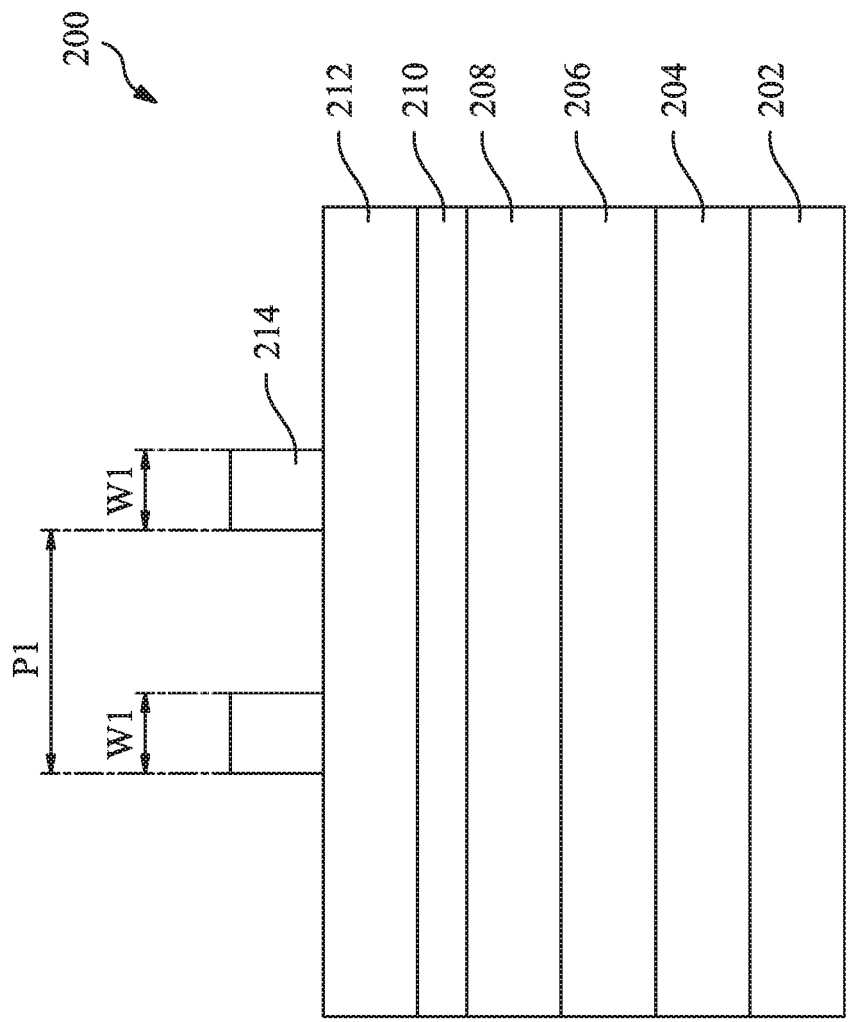
Figure 2C:
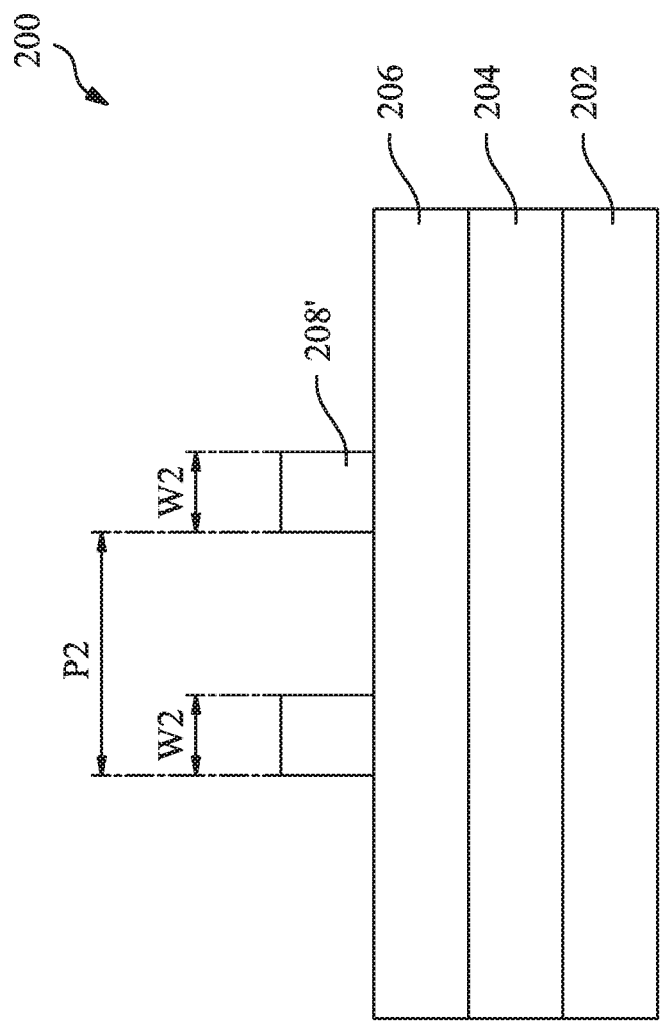

At operation 104, the method 100 (FIG. 1) forms mandrel patterns (or mandrel lines) 208' in the dielectric layer 208 (FIGS. 2B and 2C). In an embodiment, the mandrel patterns 208' are formed by a procedure including a photolithography process and one or more etching processes.

Referring to FIG. 2B, illustrated therein is a patterned photoresist (or resist pattern) 214 over layers 212 and 210 which are disposed over the dielectric layer 208. In an embodiment, the layer 212 is a silicon-containing hard mask layer and the layer 210 is an anti-reflective coating layer. The layers 210 and 212 may be formed using CVD, PVD, or other suitable methods. In another embodiment, the resist pattern 214 may be formed directly over the dielectric layer 208 without the layers 212 and 210. In an embodiment, the resist pattern 214 is formed using a photolithography process. For example, a resist layer is formed on the layer 212 using a spin-coating process and soft baking process. Then, the resist layer is exposed to a radiation using a mask having the definitions for the mandrel patterns 208'. The exposed resist layer is developed using post-exposure baking, developing, and hard baking thereby forming the resist pattern 214 over the layer 212. The resist pattern 214 has a pitch P1 and a width W1 in the "X" direction. In an embodiment, the "X" direction is a transistor channel length (or gate length) direction and the "Z" direction is the normal of the substrate 202 (or a pattern height direction).

Subsequently, the layers 212, 210, and 208 are etched through the openings of the resist pattern 214, forming the mandrel patterns 208' (FIG. 2C). The etching process may include a dry (or plasma) etching, a wet etching, or other suitable etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. The resist pattern 214 is removed thereafter using a suitable process, such as wet stripping or plasma ashing. The layers 212 and 210 are also removed using one or more of the etching processes, resulting in the mandrel patterns 208' over the dielectric layer 206 as shown in FIG. 2C. The mandrel patterns 208' have a pitch P2 and a width W2 in the "X" direction, which substantially match the pitch P1 and the width W1 respectively, with the consideration of feature variation through the above patterning processes.

Figure 2D:
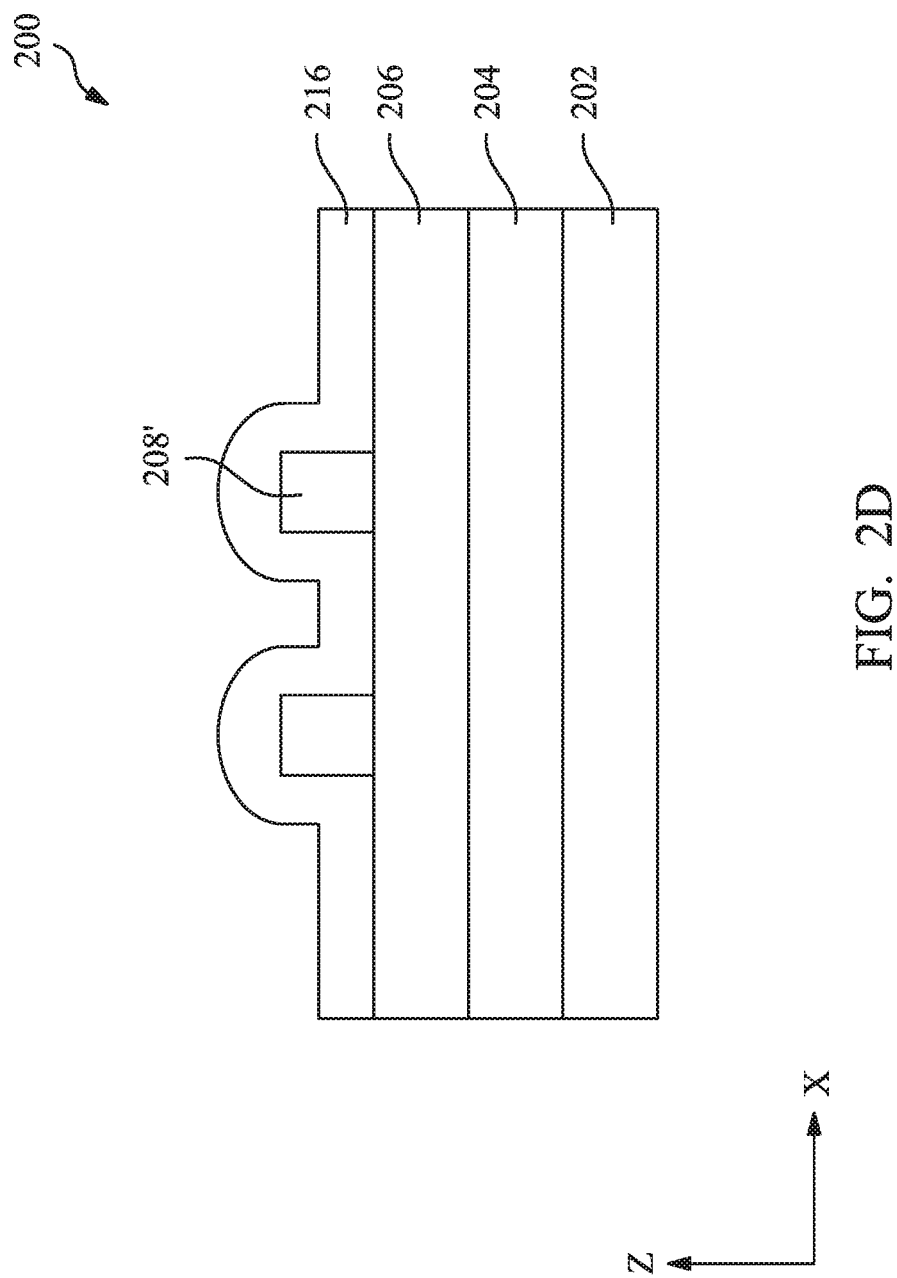

At operation 106, the method 100 (FIG. 1) forms a spacer layer 216 over the dielectric layer 206, over the mandrel patterns 208', and onto sidewalls of the mandrel patterns 208'. Referring to FIG. 2D, the spacer layer 216 is disposed over the dielectric layer 206 and the mandrel patterns 208'. The spacer layer 216 includes one or more materials different from the mandrel patterns 208' so that the layers 216 and 208 have different etching selectivity with respect to an etching process. In an embodiment, the spacer layer 216 may include a dielectric material, such as titanium nitride, silicon nitride, or titanium oxide. In an embodiment, the spacer layer 216 includes silicon nitride having a thickness about 350 Å. The spacer layer 216 may be formed by a CVD process, a PVD process, an atomic layer deposition (ALD) process, or other suitable deposition techniques.

Figure 2E:
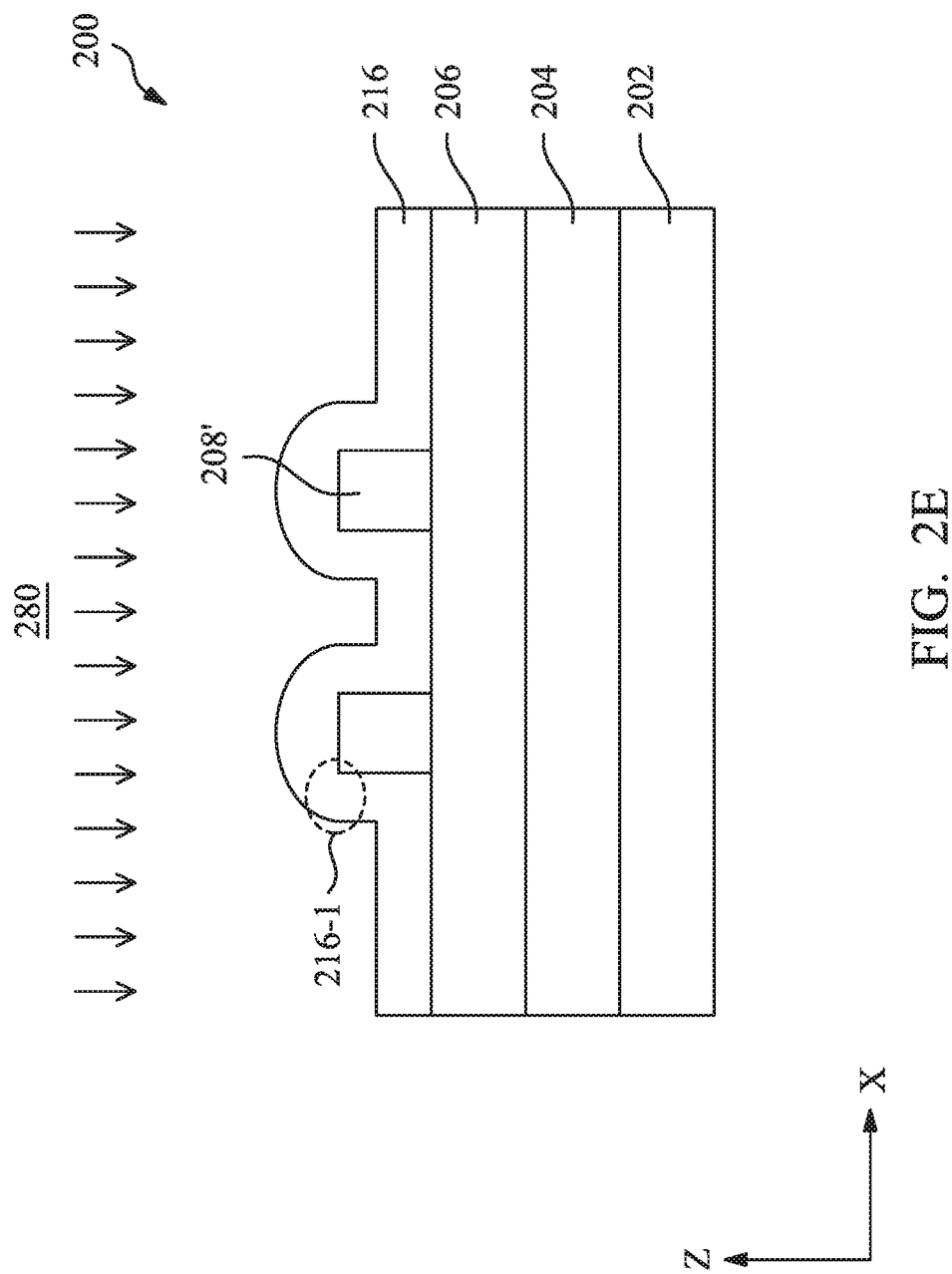

At operation 107, the method 100 (FIG. 1) performs an oxidation process 280 to the spacer layer 216. Referring to FIG. 2E, in an embodiment, the oxidation process 280 is performed with an oxygen plasma and is further biased with a certain voltage to increase a thickness of the spacer layer 216. Particularly, shoulder portions (one of them is illustratively enclosed by the dashed line 216-1) of the spacer layer 216 are thickened or hardened by the oxidation process 280. An objective of the operation 107 is to achieve a certain height of the spacer layer 216 along the "Z" direction for subsequent etching operations. As will be shown, the portions of the spacer layer 216 on the sidewalls of the mandrel patterns 208' will be used as an etch mask for etching the dielectric layer 206. Therefore, certain height of the spacer layer 216 is desirable. In an embodiment, the oxidation process 280 is performed with a pressure of 5 to 15 mTorr, a source power of 900 to 1100 W, a bias voltage of 100 to 200 V, and an oxygen flow of 180 to 220 standard cubic centimeters per minute (sccm). The oxidation process 280 may be performed for 15 seconds to 50 seconds in various embodiments.

Figure 2F:
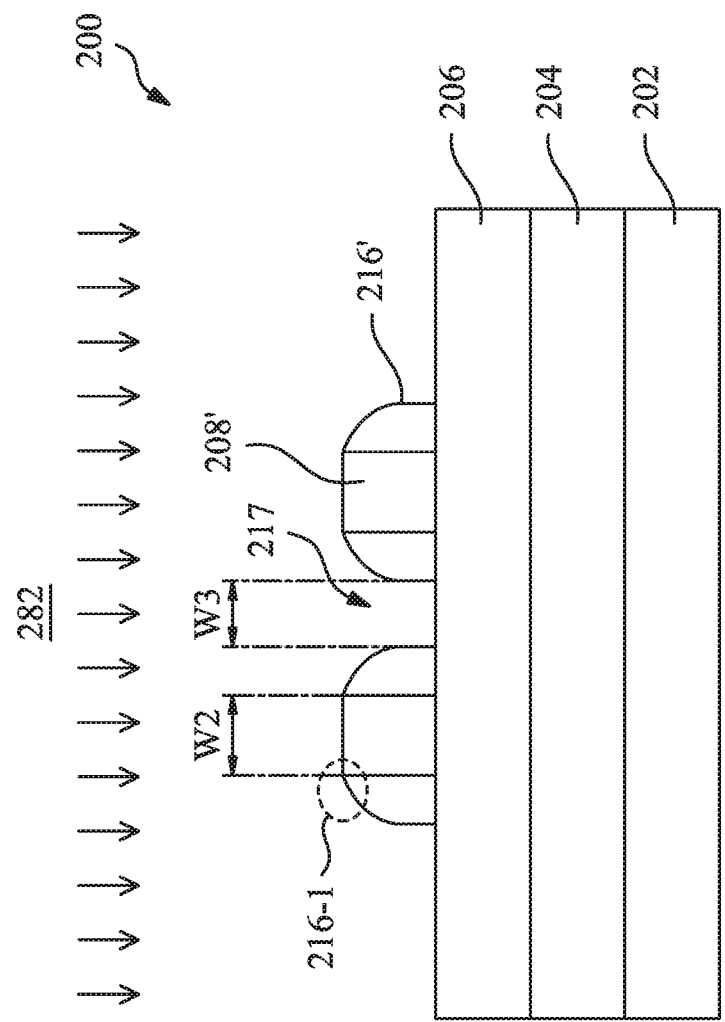

At operation 108, the method 100 (FIG. 1) performs an etching process 282 to the spacer layer 216, thereby exposing the mandrel patterns 208' and the dielectric layer 206. Referring to FIG. 2F, top surfaces of the mandrel patterns 208' are exposed by the etching process 282 and the spacer material disposed over the dielectric layer 206 is also partially removed, providing spacer features (also referred to as patterned spacer layer) 216' on sidewalls of the mandrel patterns 208'. A trench 217 is formed between adjacent sidewalls of the patterned spacer layer 216' with a dimension W3 along the "X" direction.

In an embodiment, the etching process 282 includes an anisotropic dry etching technique that removes the spacer layer 216 much faster along the "Z" direction than along the "X" direction. In the present embodiment, because the shoulder portions of the spacer layer 216 are thickened or hardened by the oxidation process 280, the patterned spacer layer 216' still has a desired height along the "Z" direction after the etching process 282 completes. In an embodiment, the etching process 282 uses a fluorine-containing gas (e.g., $CF_4$, $SF_6$, $CH_2F_2$, $CHF_3$, and/or $C_2F_6$) as an etchant, oxygen gas as an etching promoter, and argon gas as a carrier. In alternative embodiments, the etching process 282 may use a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In the present embodiment, the dimension W3 is smaller than the dimension W2.

Figure 2G:
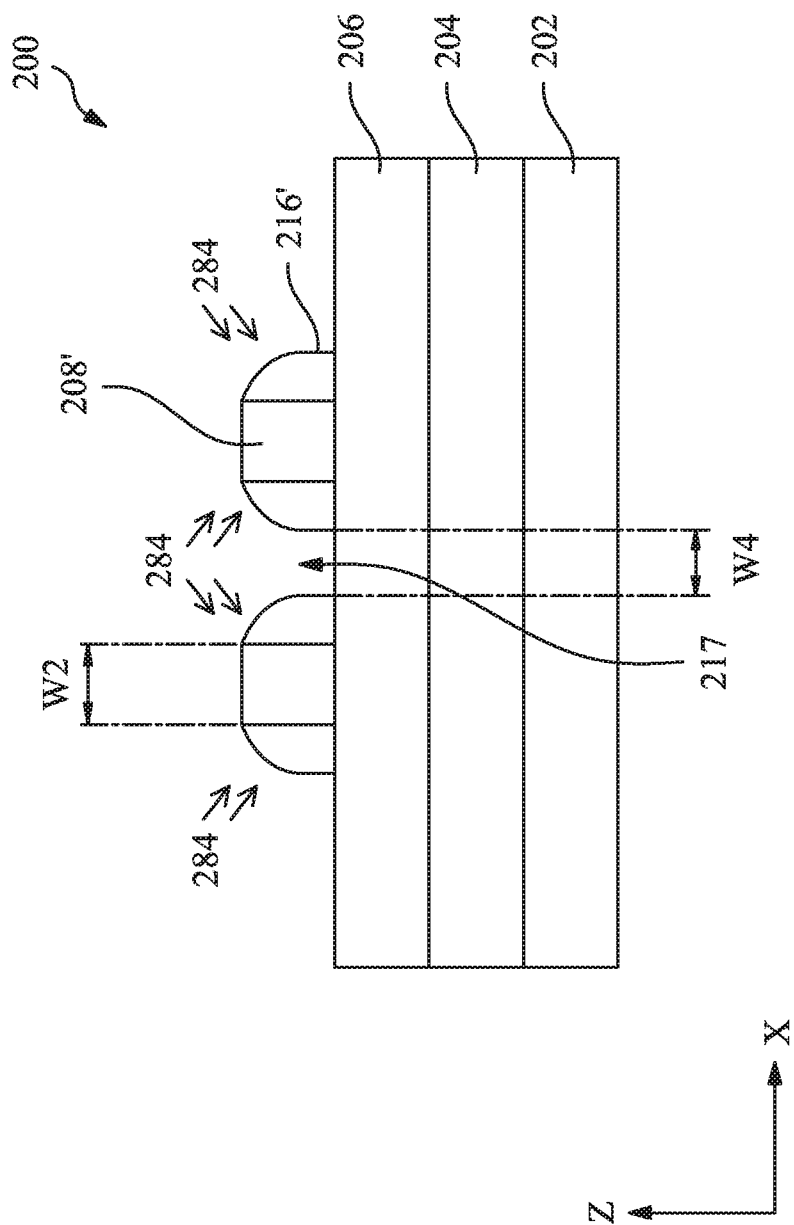

At operation 110, the method 100 (FIG. 1) trims the patterned spacer layer 216'. Referring to FIG. 2G, the patterned spacer layer 216' is trimmed by a trimming process 284. In an embodiment, the trimming process 284 is a dry etching process. In a further embodiment, the trimming process 284 is an isotropic dry etching process. In one example, the trimming process 284 is performed at a pressure of 5 to 20 mTorr, a source power of 700 to 800 W, a $CF_4$ gas flow of 125 to 225 sccm, and without a bias voltage. In alternative embodiments, the trimming process 284 may use another fluorine-containing gas (e.g., $SF_6$, $CH_2F_2$, $CHF_3$, and/or $C_2F_6$), an oxygen-containing gas, a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In various embodiments, the trimming process 284 uses an etchant that is selectively tuned to etch the patterned spacer layer 216' while the mandrel patterns 208' and the dielectric layer 206 remain substantially unchanged. In an embodiment, the thickness and the height of the patterned spacer layer 216' are reduced at about the same rate. In the present embodiment, the thickness of the patterned spacer layer 216' is reduced at a faster rate than the height is reduced due to the oxidation process 280 performed in the operation 107.

In the present embodiment, the patterned spacer layer 216' is trimmed such that the spacing W4 between adjacent sidewalls of the patterned spacer layer 216' substantially matches the dimension W2. In an embodiment, the operations 104 and 110 are implemented using an automatic process control (APC). In an exemplary APC according to the present disclosure, the width W2 of the mandrel patterns 208' is measured after the operation 104 completes, and the spacing W3 (FIG. 2F) is measured prior to the operation 110. Then, a difference (diff=W2−W3) is used for controlling parameters of the trimming process 284 (e.g., the etching gas flow, source power, pressure, and etching time thereof) so that W4 substantially matches W2 when the trimming process 284 completes.

It is noted that each of the spacer features 216' is trimmed (or etched) only on one side that is not adjacent to the mandrel patterns 208'. The sides of the spacer features 216' that are adjacent to respective mandrel patterns 208' are not etched by the trimming process 284. This overcomes a common issue known as "pitch walking" in typical mandrel-spacer patterning processes. In a typical mandrel-spacer patterning process, spacer features are trimmed after mandrel patterns are removed (referred to as a "trim-last" process). Consequently, the spacer features are trimmed on both sides. If the mandrel patterns' width does not match the spacer features' spacing before the mandrel patterns are removed, such "trim-last" process doses not correct this mismatch, and the final pattern will have two pattern pitches: one corresponding to the mandrel patterns' width, and the other one corresponding to the spacer features' spacing. This is known as "pitch walking." Pitch walking may cause problems in the final IC products. For example, when patterning for transistor gate features, pitch walking will lead to variations in the gate length, causing circuit performance mismatch or other issues. In contrast, embodiment of the present disclosure advantageously corrects such width-spacing mismatches by trimming the spacer features 216' before removing the mandrel patterns 208' (a "trim-first" process).

Furthermore, in some embodiments of the present disclosure, the oxidation process 280, the etching process 282, and the trimming process 284 are all dry processes. Therefore, they may be implemented in the same process chamber for improved production efficiency. In an alternative embodiment, they may be implemented in separate process chambers of the same cluster tool and share a common loading dock of the cluster tool. This, too, provides improved production efficiency over a process that includes both dry and wet processes.

Figure 2H:
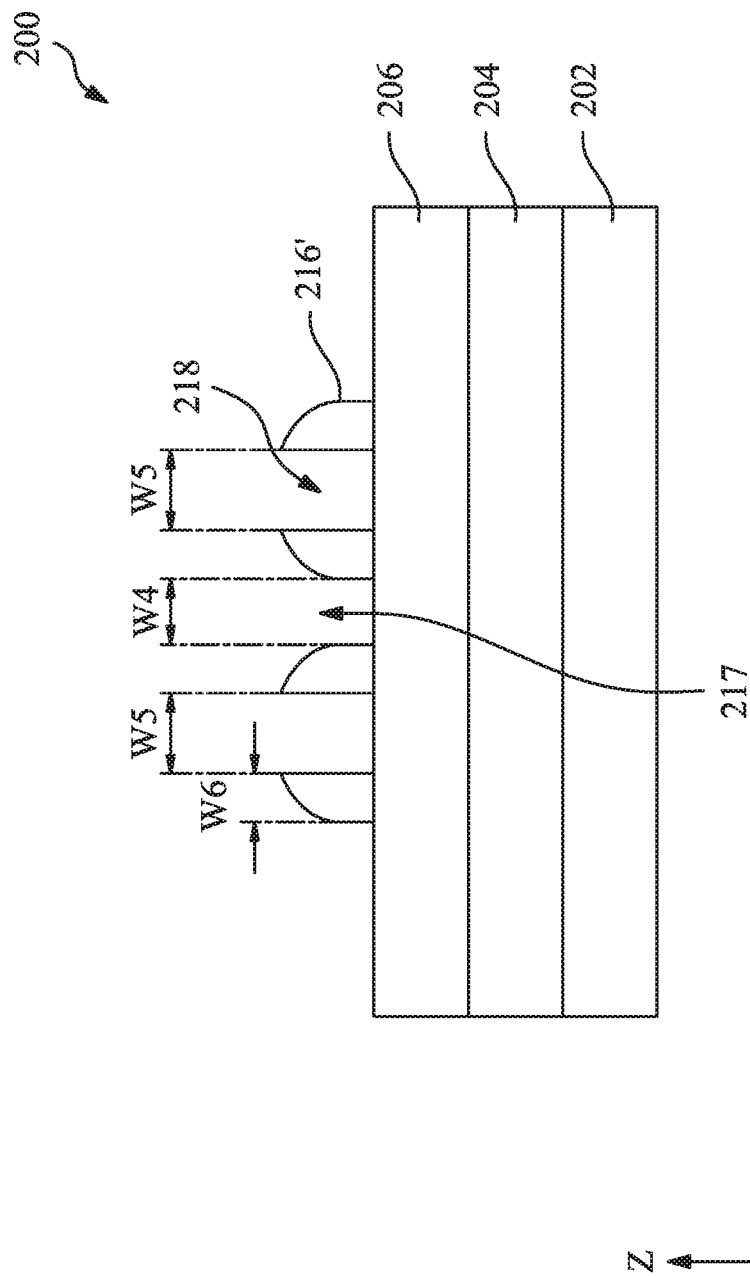

At operation 112, the method 100 (FIG. 1) removes the mandrel patterns 208' by a selective etching process. Referring to FIG. 2H, the mandrel patterns 208' are removed, resulting in trenches 218 between two opposing spacer features 216'. The trenches 218 have a dimension W5 which substantially matches the dimension W2 and, accordingly, W4 as well. The spacer features 216' remain standing over the dielectric layer 206. In an embodiment, the operation 112 uses an etching process selectively tuned to remove the materials of the mandrel patterns 208' but not the materials of the spacer features 216'. In a further embodiment, the etching process is selectively tuned to remove the materials of the mandrel patterns 208' but not the materials of the dielectric layer 206. The etching process can be a wet etching, a dry etching, or a combination thereof.

In an embodiment, the method 100 may perform another trimming of the spacer features 216' so that a CD (e.g., a width W6 of the spacer features 216') matches a desired dimension for a final pattern. During this process, the spacer features 216' are trimmed on both sides simultaneously, thereby the widths W4 and W5 are approximately equally expanded. One advantage of this embodiment is that the final pattern CD can be adjusted without affecting its pattern pitch, thereby achieving uniform CD and uniform pattern pitch at the same time.

Figure 2I:
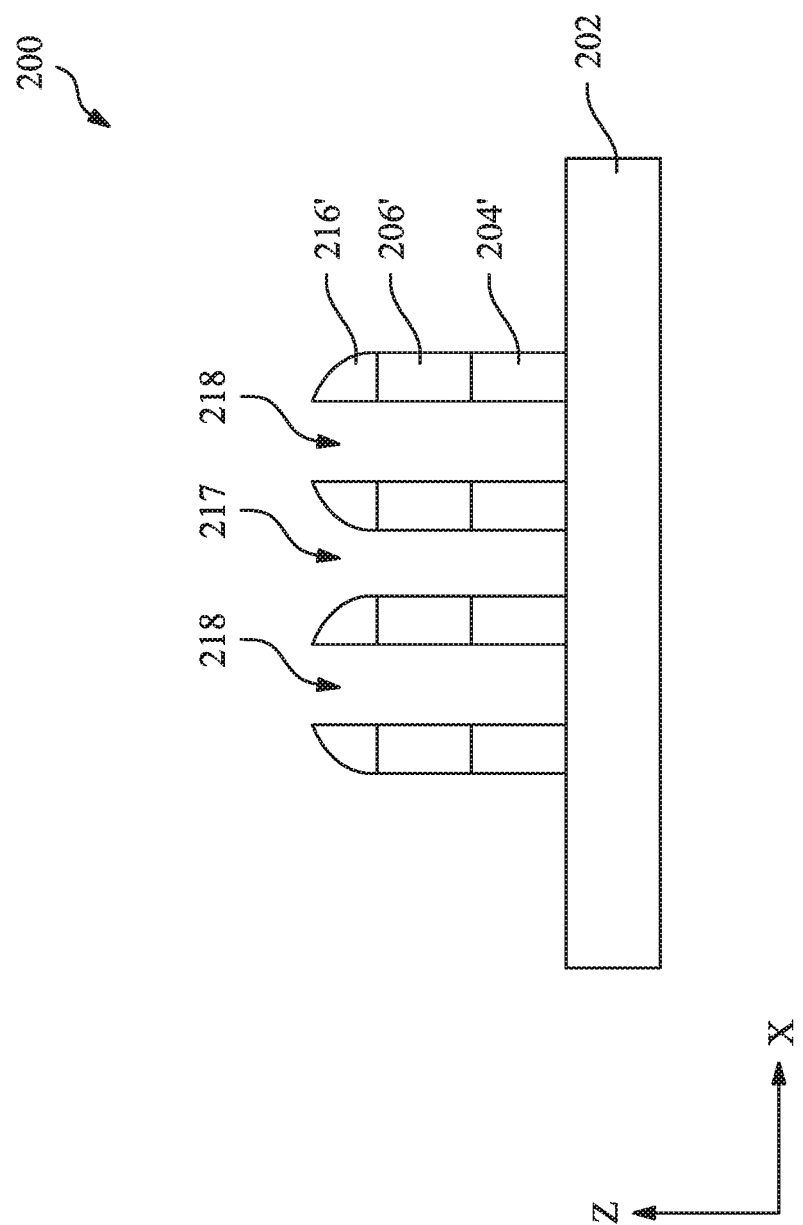
Figure 2J:
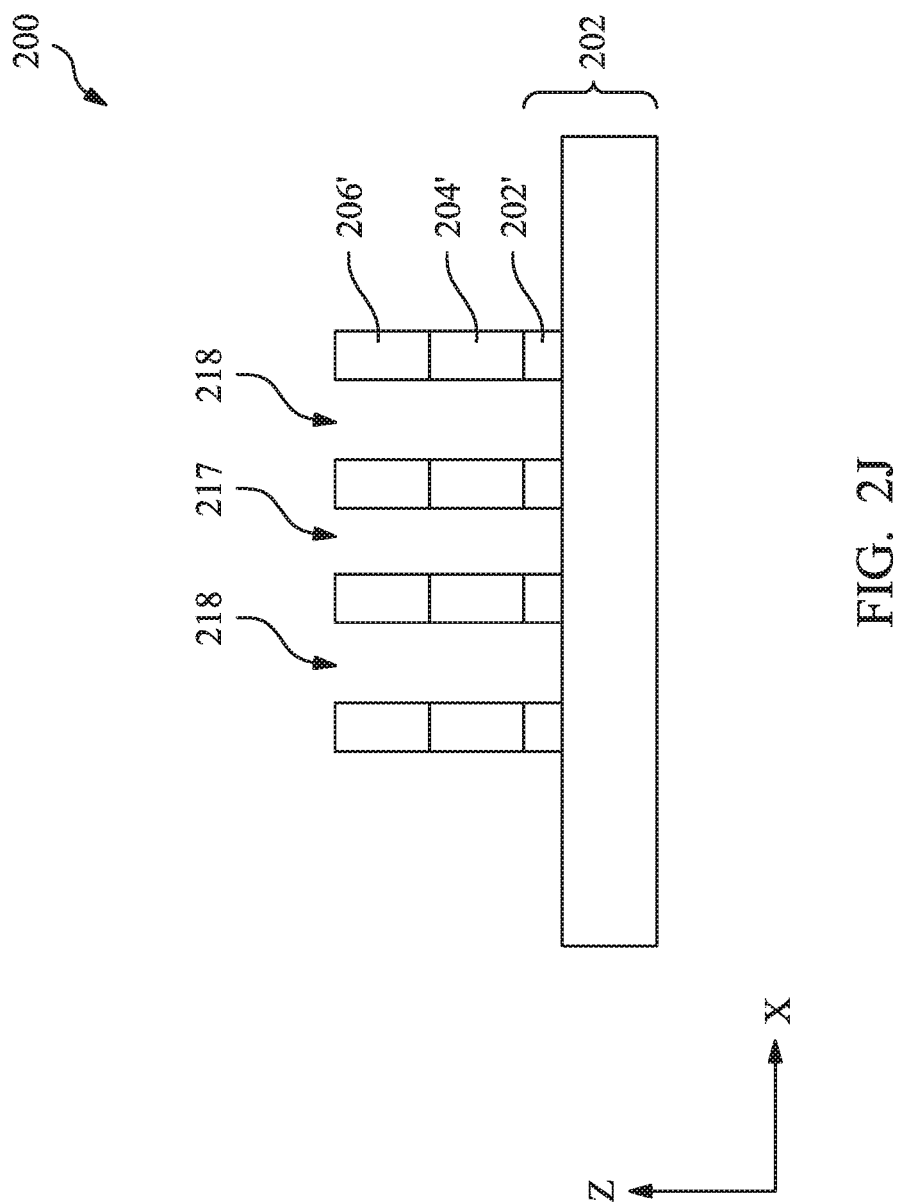

At operation 114, the method 100 (FIG. 1) transfers the patterns of the spacer features 216' to the substrate 202. Referring to FIG. 2I, the dielectric layers 206 and 204 are etched using the spacer features 216' as an etch mask, resulting in patterned dielectric layers 206' and 204'. The spacer features 216' may be partially or completely consumed during the etching process. Referring to FIG. 2J, the substrate 202 is etched using at least the patterned dielectric layers 206' and 204' as an etch mask. In an embodiment, a layer of polysilicon, as an upper layer of the substrate 202, is etched to form polysilicon features 202'. Due to at least the trimming process 284, the polysilicon features 202' have substantially uniform CD and pitch. In an embodiment, the operation 114 includes a wet etching, a dry etching, or a combination thereof.

At operation 116, the method 100 (FIG. 1) proceeds to further operations to form a final pattern or device. In an embodiment, the polysilicon features 202' are formed as dummy gate electrodes for a gate-replacement process. To further this embodiment, the operation 116 may include forming gate spacers on sidewalls of the polysilicon features 202', forming source/drain features in or on the substrate 202 adjacent the gate spacers, forming inter-layer dielectric layer over the substrate 202 and the polysilicon features 202', and replacing the polysilicon features 202' with a high-k metal gate stack using appropriate etching and deposition techniques.

In another embodiment, the features 202' are fin-like features for forming FinFETs. To further this embodiment, the operation 116 may include forming isolation structures in the trenches 217 and 218 by a procedure that includes deposition to fill the trenches 217 and 218 with a dielectric material and polishing (such as chemical mechanical planarization (CMP)) to remove excessive dielectric material and to planarize the top surface of the semiconductor substrate. The operation 116 may further include forming epitaxial features over the fin-like features 202', and/or other suitable fabrication processes.

Figure 3:
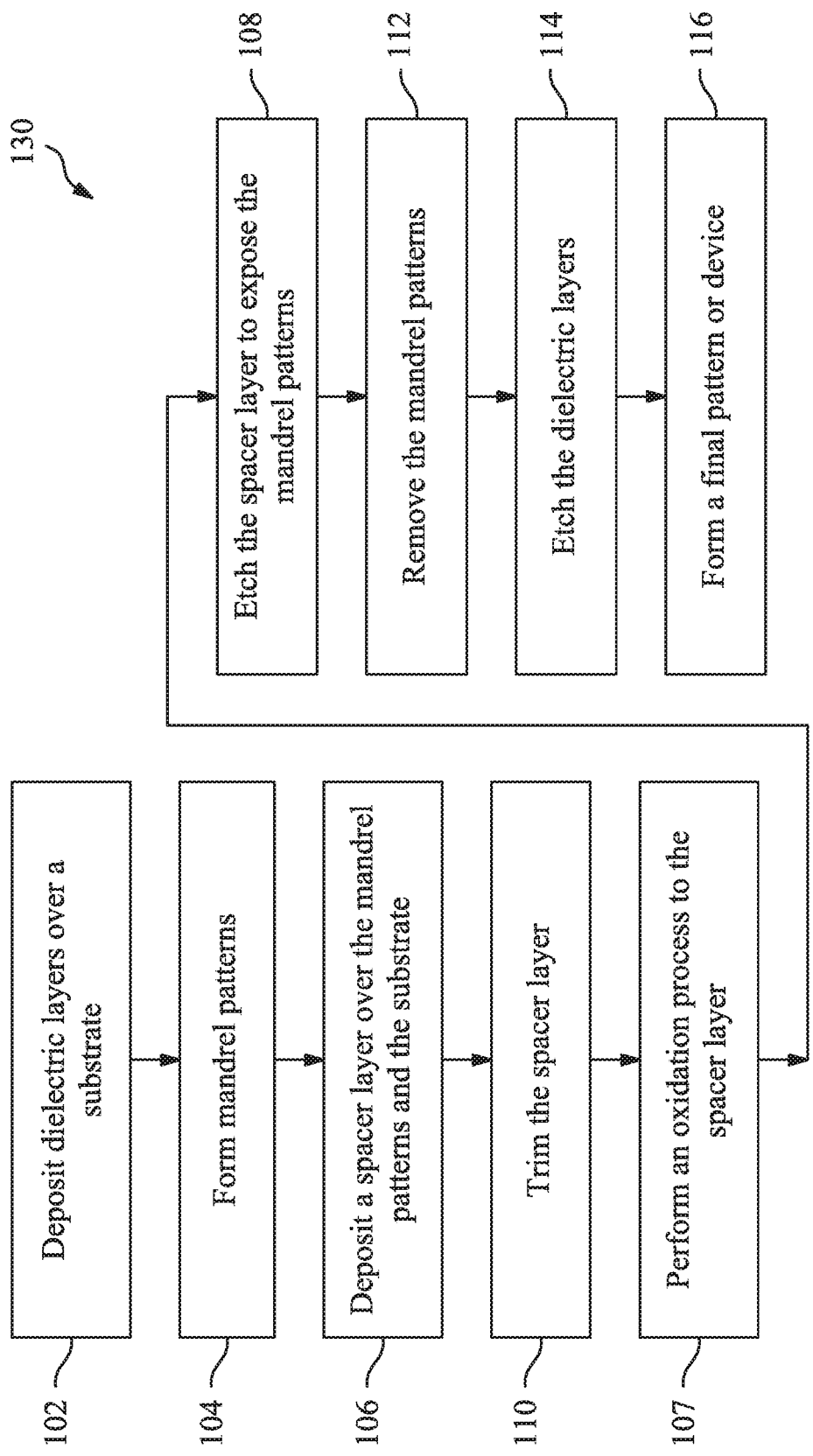
FIG. 3 illustrates a flowchart of another method of patterning a substrate according to various aspects of the present disclosure.

In embodiments of the method 100, the operations 107, 108, and 110 may be performed in various orders to achieve the same purpose of controlling final patterns' CD and pitch. To illustrate this point, FIG. 3 shows a flow chart of a method 130 which is an embodiment of the method 100. Referring to FIG. 3, in an embodiment, the method 130 performs the operation 110 (trimming spacer) before the operation 107 (oxidizing spacer) which is before the operation 108 (etching spacer). Many aspects of the method 130 are similar to those of the method 100, and are therefore omitted or abbreviated for the purposes of simplicity. The method 130 is briefly discussed below.

At operation 102, the method 130 (FIG. 3) deposits dielectric layers 204, 206, and 208 over a substrate 202, as shown in FIG. 2A. At operation 104, the method 130 (FIG. 3) forms mandrel patterns 208', as shown in FIGS. 2B and 2C. At operation 106, the method 130 (FIG. 3) deposits a spacer layer 216 over the dielectric layer 206, over the mandrel patterns 208', and onto sidewalls of the mandrel patterns 208', as shown in FIG. 2D.

Figure 4A:
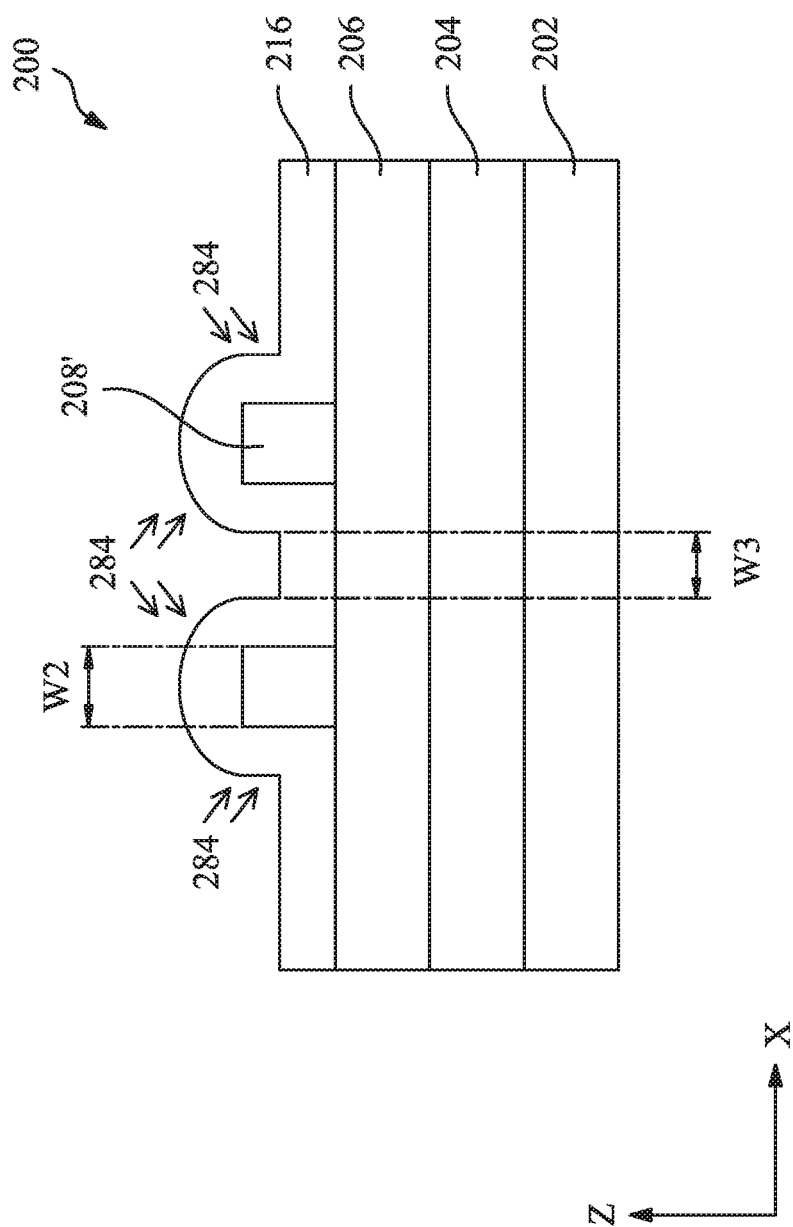
FIGS. 4A, 4B, and 4C illustrate cross-sectional views of a device in various manufacturing steps of the method in FIG. 3, in accordance with some embodiments.

The method 130 (FIG. 3) proceeds to operation 110 to trim the spacer layer 216. Referring to FIG. 4A, the operation 110 includes a trimming process 284 for reducing a width of the spacer layer 216 along the "X" direction. In the present embodiment, the spacer layer 216 is trimmed to expand a spacing W3 between adjacent sidewalls of the spacer layer 216 to substantially match a width W2 of the mandrel patterns 208'. This may be implemented as part of an APC, as discussed above with respect to FIG. 2G. In an embodiment, the trimming process 284 is an isotropic dry etching process. Further, the trimming process 284 uses appropriate etching pressure, source power, one or more etchant gases, and certain etching time in order to expand the spacing W3 properly. Other aspects of the trimming process 284 are similar to those discussed with respect to FIG. 2G.

Figure 4B:
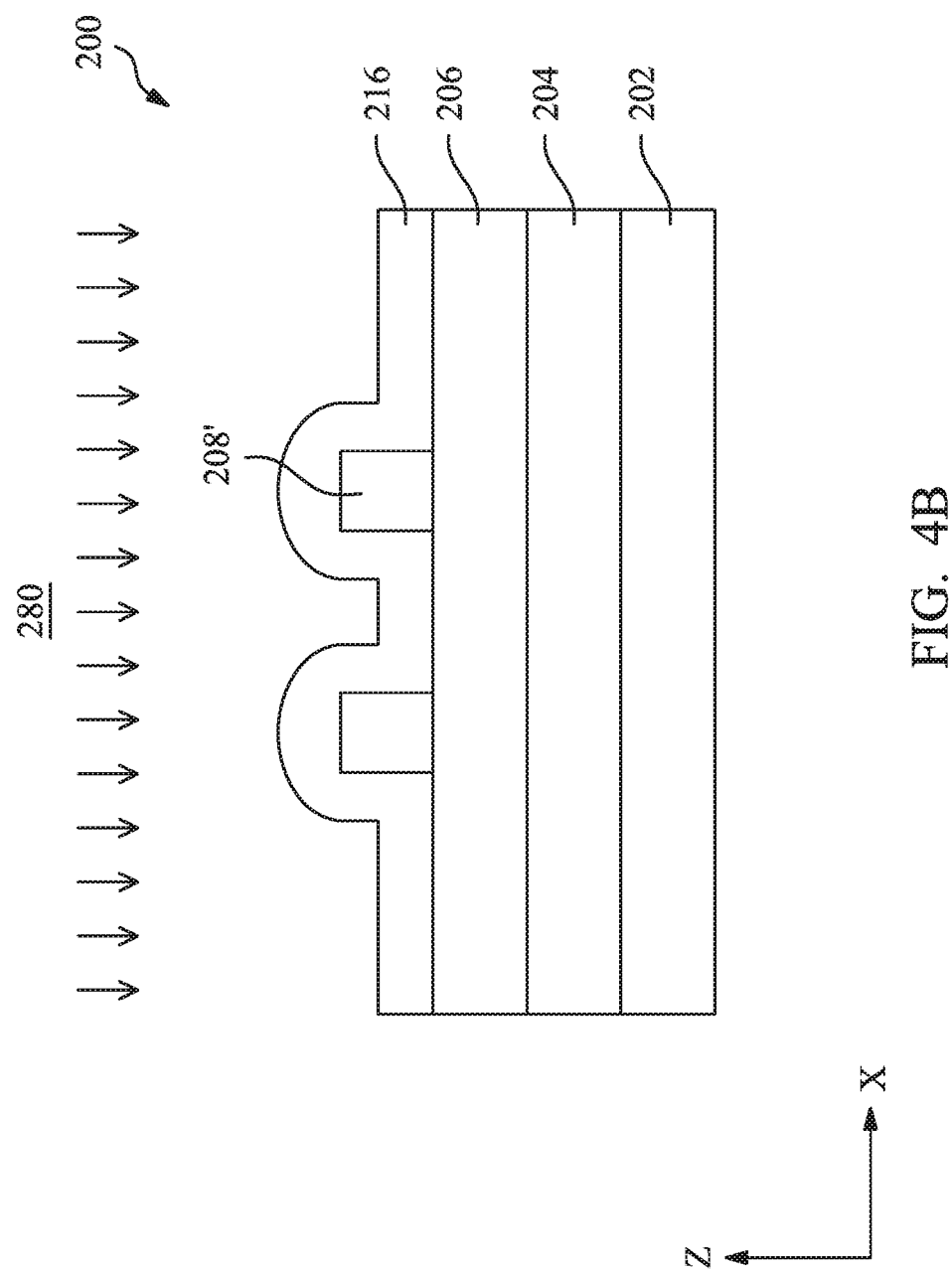

The method 130 (FIG. 3) proceeds to operation 107 to oxidize the spacer layer 216 after it has been trimmed. Referring to FIG. 4B, the operation 107 performs an oxidation process 280 to the spacer layer 216. In an embodiment, the oxidation process 280 thickens or hardens shoulder portions of the spacer layer 216, as discussed above with respect to FIG. 2E. This is desirable as the trimming process 284 may have reduced a height of the spacer layer 216 in the shoulder portions thereof.

Figure 4C:
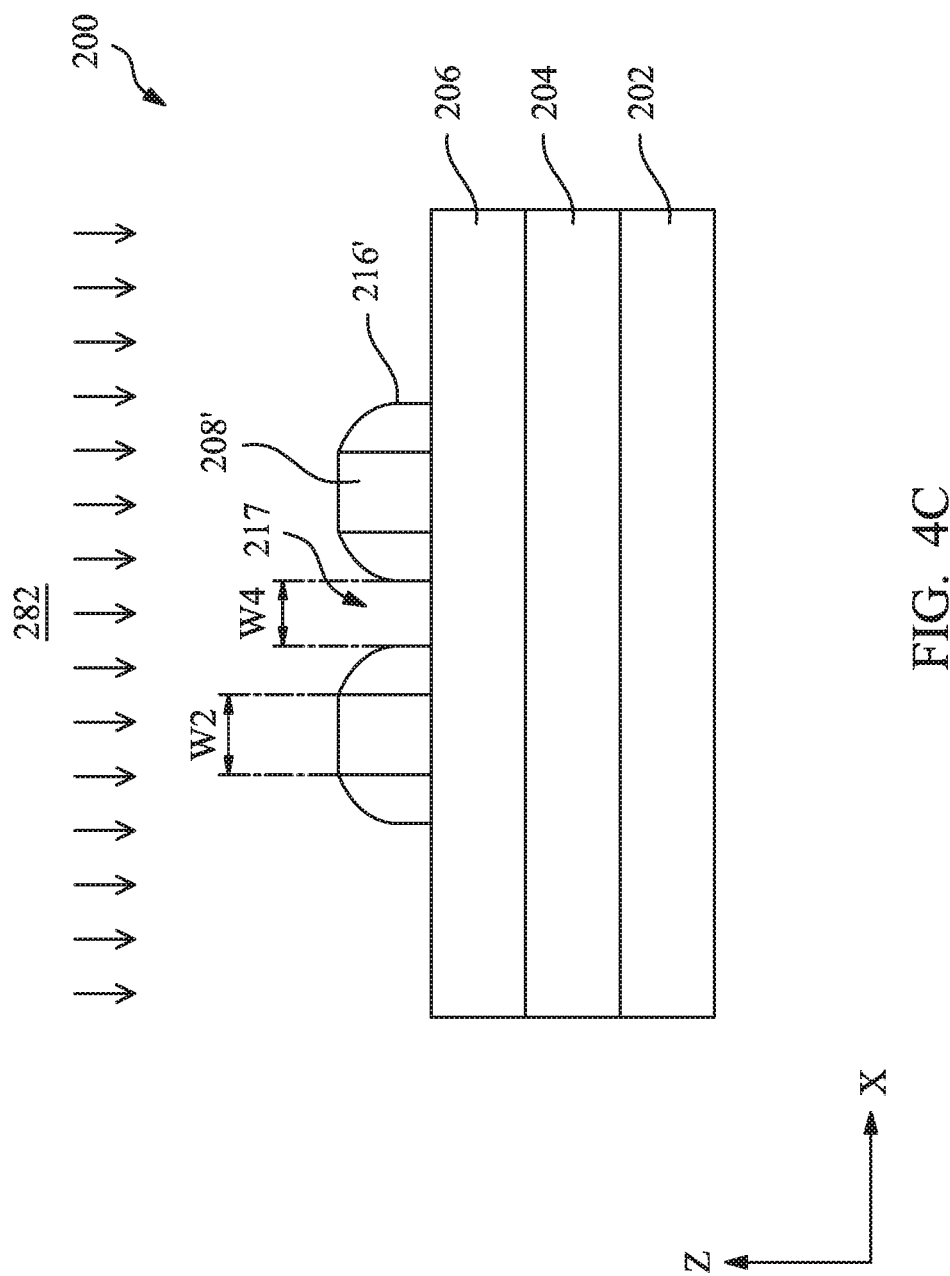

The method 130 (FIG. 3) proceeds to operation 108 to etch the spacer layer 216 after it has been oxidized. Referring to FIG. 4C, the operation 108 performs an anisotropic dry etching process 282 in an embodiment. The etching process 282 removes portions of the spacer layer 216 on the top of the mandrel patterns 208' and on the top of the dielectric layer 206, resulting in a patterned spacer layer 216' on the sidewalls of the mandrel patterns 208'. A trench 217 between adjacent sidewalls of the patterned spacer layer 216 has a width W4 along the "X" direction, which substantially matches the width W2. Other aspects of the etching process 282 are similar to those discussed with respect to FIG. 2F.

At operation 112, the method 130 (FIG. 3) removes the mandrel patterns 208', as shown in FIG. 2H. At operation 114, the method 130 (FIG. 3) etches the dielectric layers 204 and 206 and the substrate 202, as shown in FIGS. 2I and 2J. At operation 116, the method 130 (FIG. 3) forms a final pattern or device, as discussed above.

In some embodiments of the method 100, the operations 107 and 108 may include more than one etching and oxidation processes. For instance, one etching process 282 sometimes may not produce a desired profile of the spacer features 216', such as a near-vertical sidewall. In such instance, another etching process with a different etching recipe may be performed to further shape the spacer features 216'. Further, before each of the etching processes, an oxidation process 280 with same or different recipe may be performed to thicken or protect shoulder portions of the spacer feature 216'. To illustrate this point, FIG. 5 shows a flow chart of a method 150 which is an embodiment of the method 100.

Figure 5:
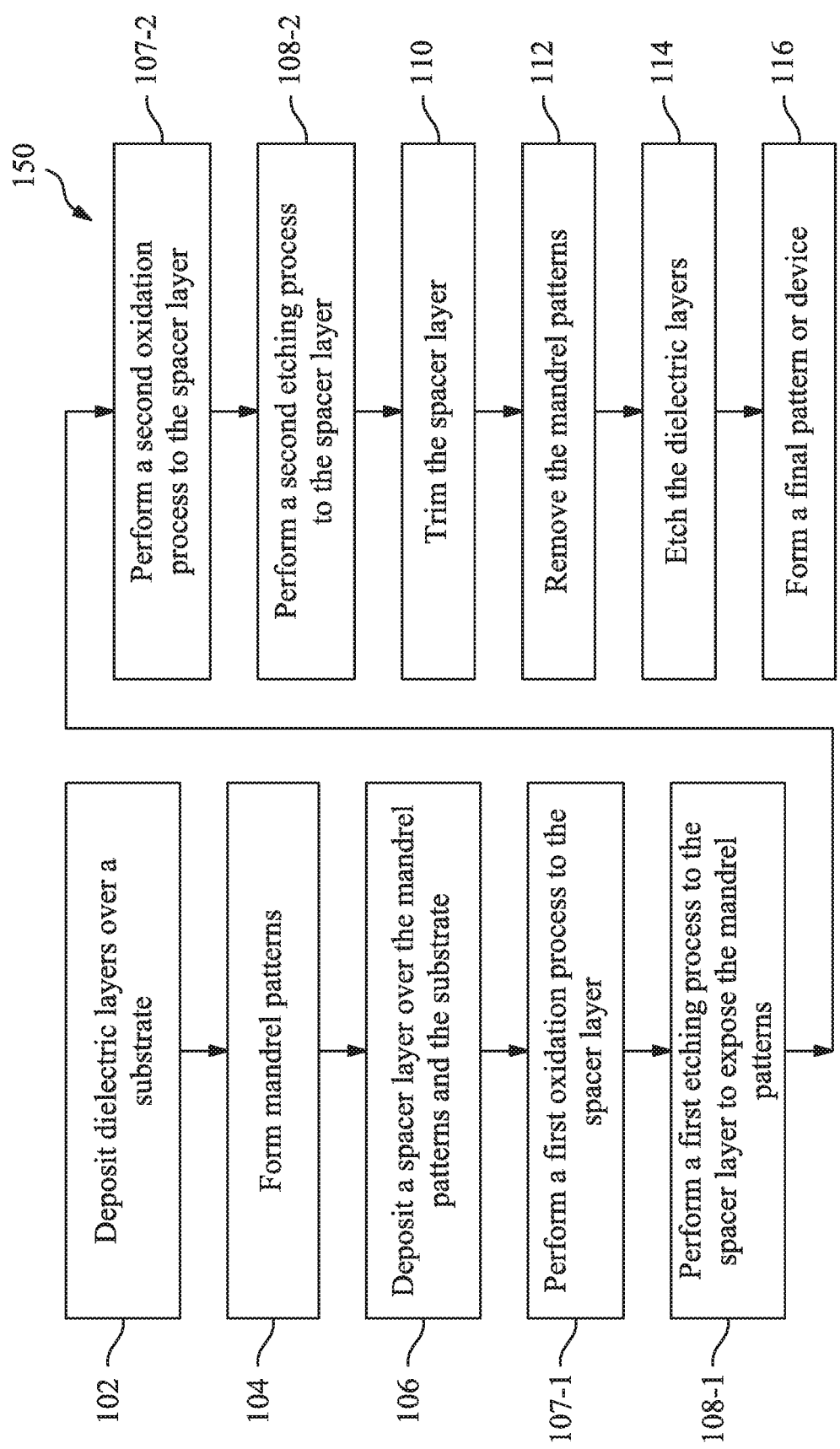
FIG. 5 illustrates a flowchart of yet another method of patterning a substrate according to various aspects of the present disclosure.

Referring to FIG. 5, in an embodiment, the method 150 performs a first oxidation process in operation 107-1, performs a first etching process in operation 108-1, performs a second oxidation process in operation 107-2, and performs a second etching process in operation 108-2. In various embodiments, the method 150 may perform two or more etching processes and two or more oxidation processes. Further, the method 150 may perform the operation 110 (trimming spacer) before or after the series of oxidation and etching processes. Many aspects of the method 150 are similar to those of the method 100, and are therefore omitted or abbreviated for the purposes of simplicity. The method 150 is briefly discussed below.

At operation 102, the method 150 (FIG. 5) deposits dielectric layers 204, 206, and 208 over a substrate 202, as shown in FIG. 2A. At operation 104, the method 150 (FIG. 5) forms mandrel patterns 208', as shown in FIGS. 2B and 2C. At operation 106, the method 150 (FIG. 5) deposits a spacer layer 216 over the dielectric layer 206, over the mandrel patterns 208', and onto sidewalls of the mandrel patterns 208', as shown in FIG. 2D.

Figure 6A:
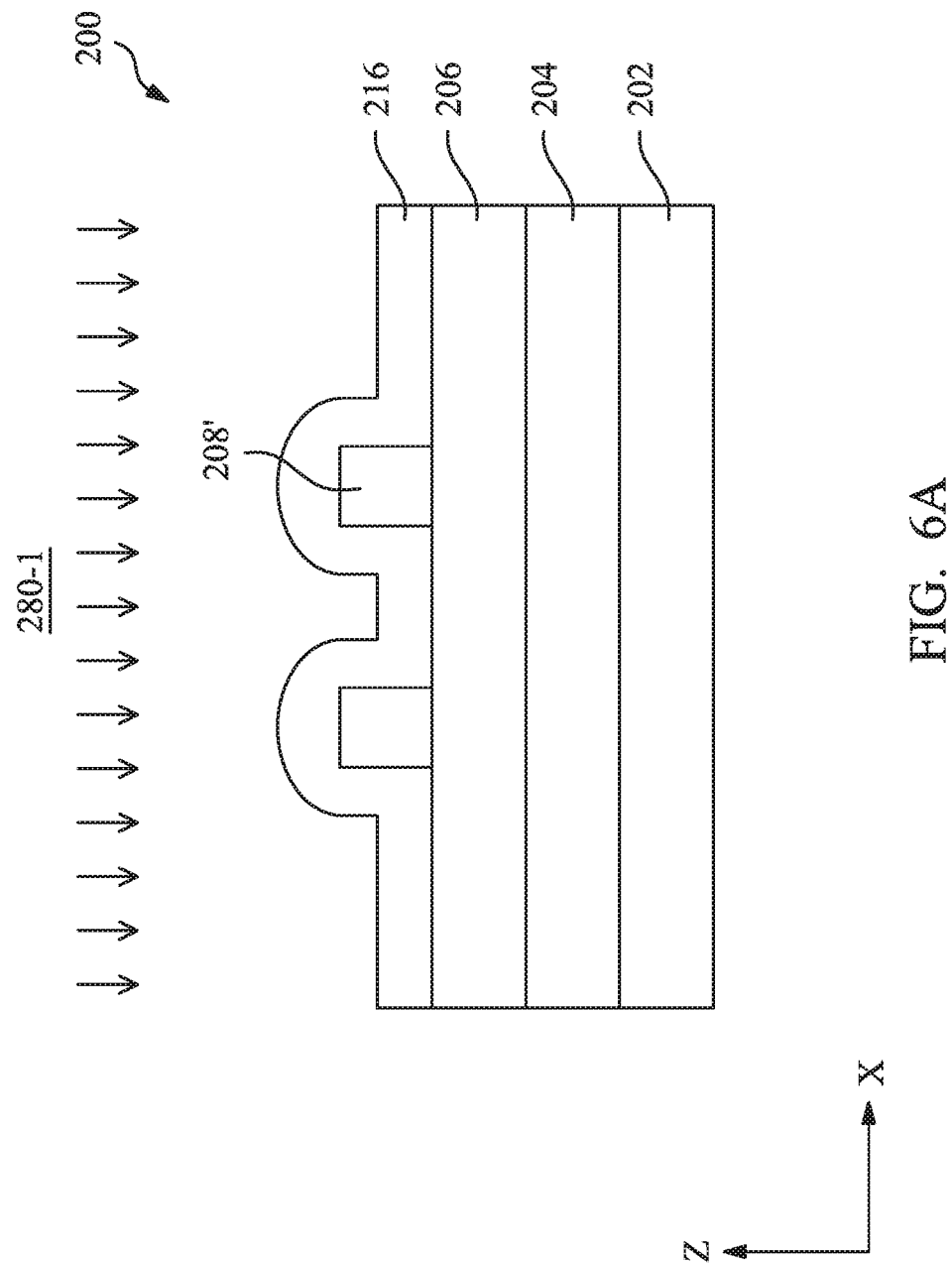
FIGS. 6A, 6B, 6C, and 6D illustrate perspective views of a device in various manufacturing steps of the method in FIG. 5.

The method 150 (FIG. 5) proceeds to the operation 107-1 to oxidize the spacer layer 216. Referring to FIG. 6A, the operation 107-1 performs a first oxidation process 280-1 to the spacer layer 216. Many respects of the oxidation process 280-1 are similar to those of the oxidation process 280 discussed with respect to FIG. 2E.

Figure 6B:
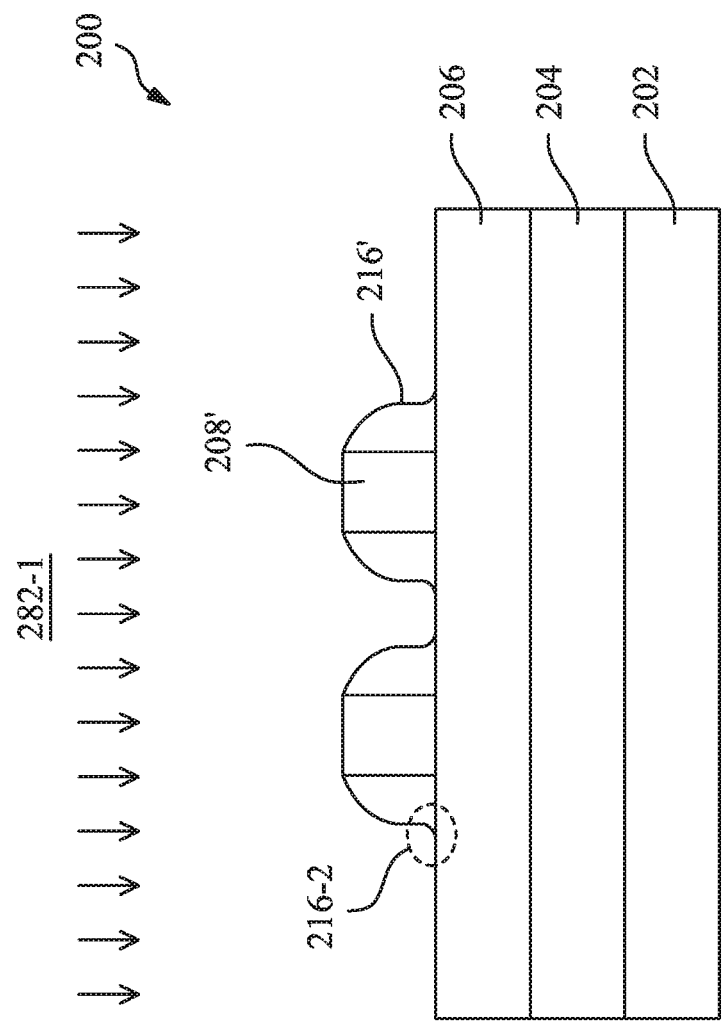

The method 150 (FIG. 5) proceeds to the operation 108-1 to etch the spacer layer 216. Referring to FIG. 6B, the operation 108-1 performs a first etching process 282-1 to open the spacer layer 216. Portions of the spacer layer 216 on the top of the mandrel patterns 208' and on the top of the dielectric layer 206 are removed, resulting in spacer features 216' on the sidewalls of the mandrel patterns 208'. However, the spacer features 216' in this embodiment do not have the desired near-vertical sidewall profile. For example, a small portion 216-2 of the spacer material remains at the corner between the dielectric layer 206 and the spacer features 216' (also referred to as "spacer footing").

Figure 6C:
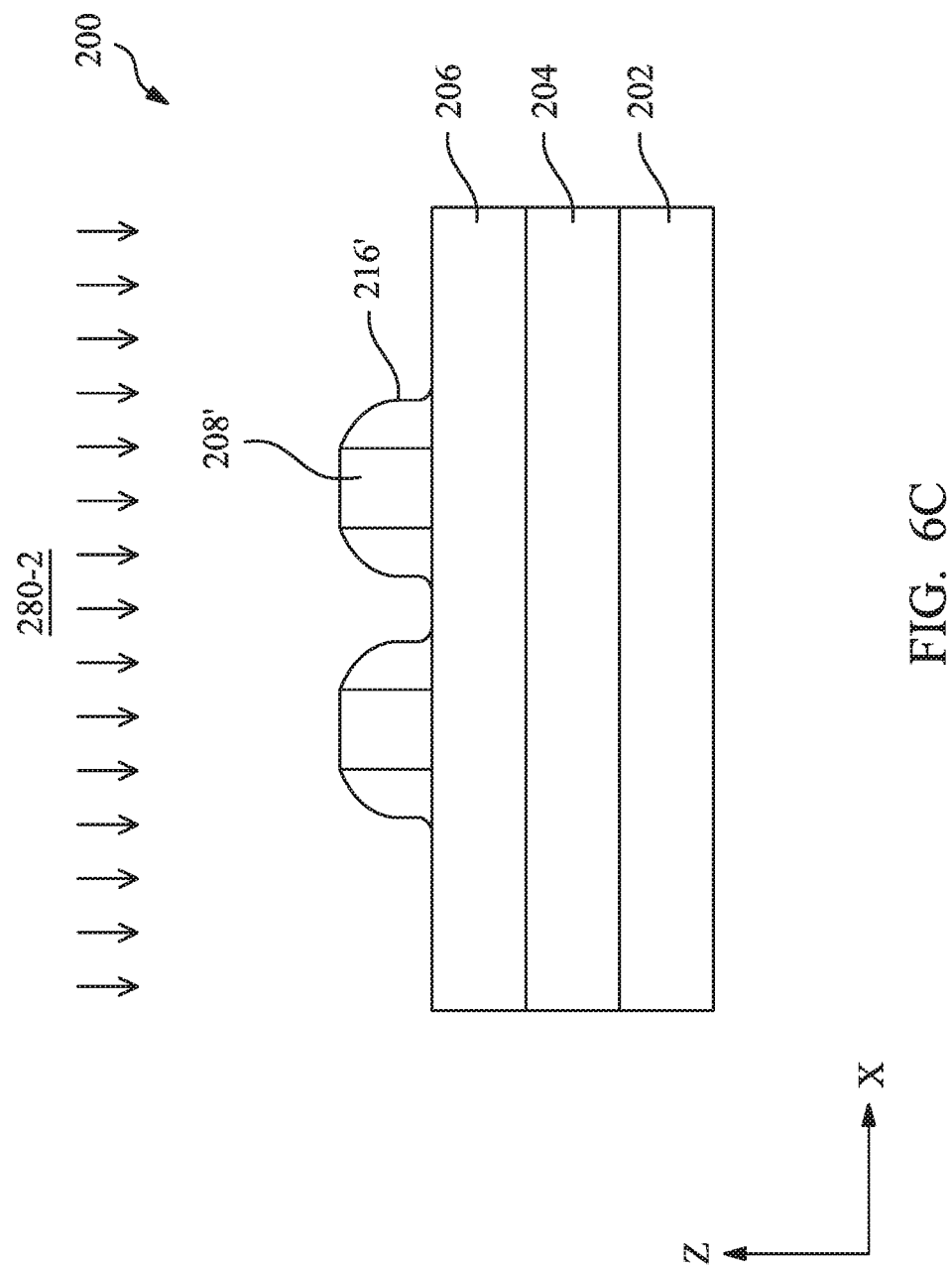

The method 150 (FIG. 5) proceeds to the operation 107-2 to oxidize the spacer features 216' again. Referring to FIG. 6C, the operation 107-2 performs a second oxidation process 280-2 to the spacer features 216'. In an embodiment, the second oxidation process 280-2 thickens or strengthens the spacer features 216' along the "Z" direction. The parameters of the oxidation process 280-2 may be similar to those of the oxidation process 280 discussed with respect to FIG. 2E.

Figure 6D:
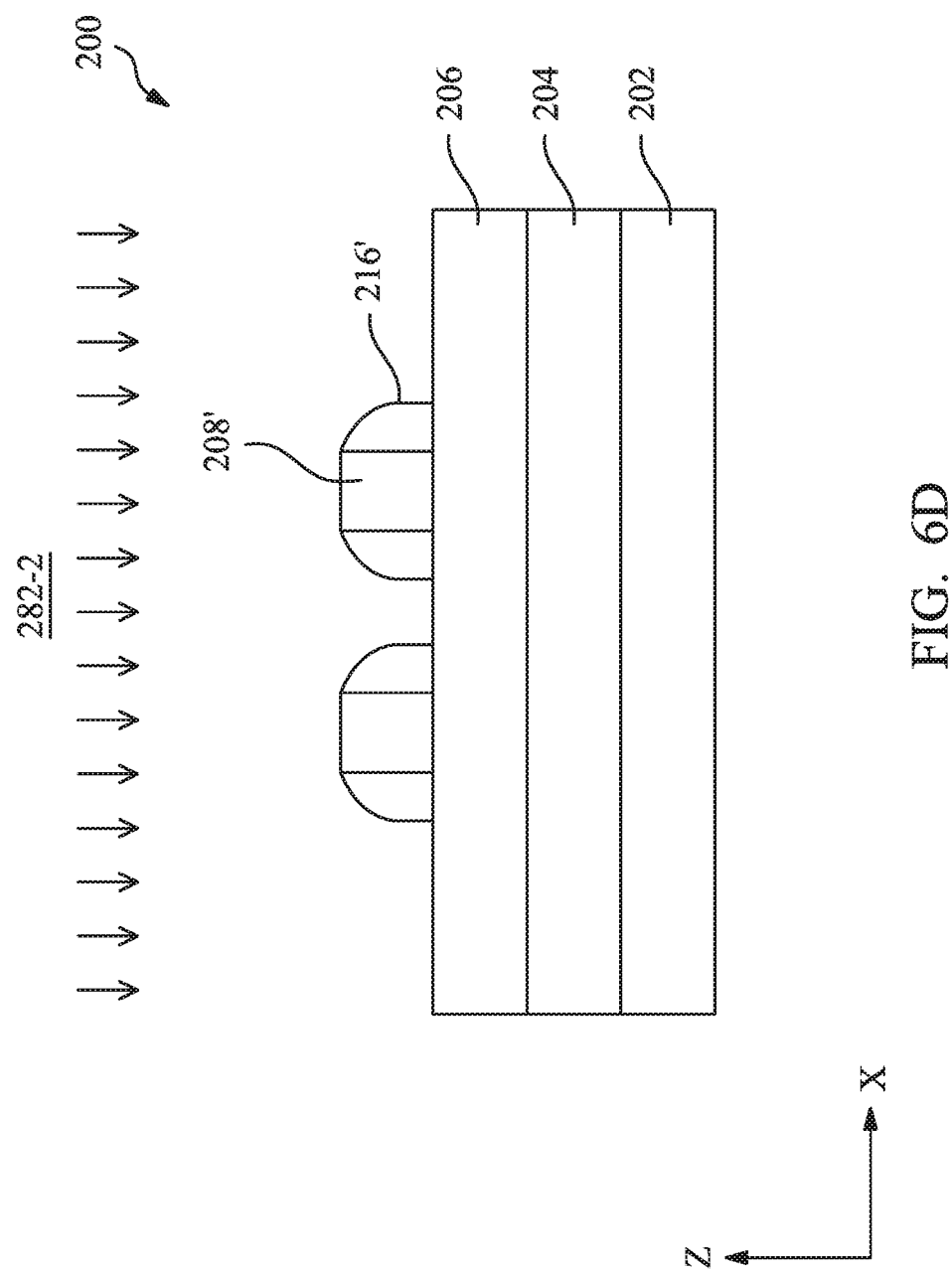

The method 150 (FIG. 5) proceeds to the operation 108-2 to further etch the spacer features 216'. Referring to FIG. 6D, the operation 108-2 performs a second etching process 282-2 with a recipe different from that of the first etching process 282-1. For example, the etching process 282-2 may use a higher pressure, a lower source power, a lower bias voltage, a lower or a different etchant gas flow, or a combination thereof, than the etching process 282-1. The etching process 282-2 produces a desired profile in the spacer features 216', including removing the spacer footing 216-2 (FIG. 6B).

At operation 110, the method 150 (FIG. 5) trims the spacer features 216', as shown in FIG. 2G. At operation 112, the method 150 (FIG. 5) removes the mandrel patterns 208', as shown in FIG. 2H. At operation 114, the method 150 (FIG. 5) etches the dielectric layers 204 and 206 and the substrate 202, as shown in FIGS. 2I and 2J. At operation 116, the method 150 (FIG. 5) forms a final pattern or device, as discussed above.

Although not intended to be limiting, the present disclosure provides many benefits to the manufacturing of an IC. For example, embodiments of the present disclosure provide an improved mandrel-spacer patterning process. Embodiments of the present disclosure use a "trim-first" technique to adjust spacing between adjacent spacer features. This enables separate tuning of a final pattern's CD and pitch, thereby providing improved CD uniformity and pitch uniformity in the final pattern. This provides an efficient and effective approach for process fine-tuning, and can be easily integrated into existing manufacturing flow.

In one exemplary aspect, the present disclosure is directed to a method. The method includes forming mandrel patterns over a patterning layer over a substrate; and forming a spacer layer over the patterning layer, over the mandrel patterns, and onto sidewalls of the mandrel patterns. The method further includes trimming the spacer layer using a dry etching technique such that a space between adjacent sidewalls of the spacer layer substantially matches a dimension of the mandrel patterns along a pattern width direction. The method further includes etching the spacer layer to expose the mandrel patterns and the patterning layer, resulting in a patterned spacer layer on the sidewalls of the mandrel patterns. After the trimming of the spacer layer and the etching of the spacer layer, the method further includes removing the mandrel patterns.

In another exemplary aspect, the present disclosure is directed to a method. The method includes forming a patterning layer over a substrate; forming mandrel patterns over the patterning layer; and forming a spacer layer over the patterning layer, over the mandrel patterns, and onto sidewalls of the mandrel patterns. The method further includes trimming the spacer layer using an isotropic dry etching technique so that a space between adjacent sidewalls of the spacer layer substantially matches a dimension of the mandrel patterns along a pattern width direction. The method further includes etching the spacer layer using an anisotropic dry etching technique to expose the mandrel patterns and the patterning layer, resulting in a patterned spacer layer on the sidewalls of the mandrel patterns. The method further includes removing the mandrel patterns after the trimming of the spacer layer and the etching of the spacer layer. The method further includes transferring a pattern of the patterned spacer layer to the patterning layer after the removing of the mandrel patterns.

In yet another exemplary aspect, the present disclosure is directed to a method. The method includes depositing a patterning layer over a substrate; forming mandrel patterns over the patterning layer; and forming a spacer layer over the patterning layer, over the mandrel patterns, and onto sidewalls of the mandrel patterns. The method further includes performing an oxidation process to the spacer layer; and etching the spacer layer using an anisotropic dry etching technique to expose the mandrel patterns and the patterning layer, resulting in a patterned spacer layer on the sidewalls of the mandrel patterns. The method further includes trimming the spacer layer using an isotropic dry etching technique so that a space between adjacent sidewalls of the spacer layer substantially matches a dimension of the mandrel patterns along a pattern width direction. The method further includes removing the mandrel patterns after the performing of the oxidation process, the trimming, and the etching.

The foregoing outlines features of several embodiments so that those having ordinary skill in the art may better understand the aspects of the present disclosure. Those having ordinary skill in the art should appreciate that they may readily use the present disclosure as a basis for designing or modifying other processes and structures for carrying out the same purposes and/or achieving the same advantages of the embodiments introduced herein. Those having ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a patterning layer over a substrate;
   performing a deposition process, a lithography process, and a first etching process to form mandrel features having a first width and a first pitch over the patterning layer, wherein the first width and the first pitch are substantially equal respectively to a second width and a second pitch of resist patterns formed by the lithography process;

depositing a spacer layer over the mandrel features;
performing a second etching process to partially remove the spacer layer to expose a portion of the mandrel features and a portion of the patterning layer, wherein the second etching process is configured to avoid etching of the mandrel features and the patterning layer;
performing a third etching process to partially remove the spacer layer and adjust spacing between adjacent sidewalls of the spacer layer, such that the spacing is substantially equal to the first width of the mandrel features, wherein the third etching process is configured to avoid etching of the mandrel features and the patterning layer; and
after performing the second etching process and the third etching process, performing a fourth etching process to completely remove the mandrel features, wherein the fourth etching process is configured to avoid etching of the spacer layer.

2. The method of claim 1, further comprising:
measuring the width of the mandrel features before the depositing the spacer layer over the mandrel features; and
measuring the spacing between the adjacent sidewalls of the spacer layer before the performing the third etching process, wherein the third etching process increases the spacing from a first spacing less than the first width of the mandrel features to a second spacing substantially equal to the first width of the mandrel features.

3. The method of claim 1, wherein the second etching process and the third etching process are performed in the same tool.

4. The method of claim 3, wherein:
the performing the second etching process includes performing a first dry etching process; and
the performing the third etching process includes performing a second dry etching process that is different than the first dry etching process.

5. The method of claim 1, further comprising, before performing the third etching process, performing a process that increases a height of the spacer layer, such that the third etching process reduces a thickness of the spacer layer at a faster rate than a height of the spacer layer.

6. The method of claim 1, wherein:
the spacer layer includes titanium nitride, silicon nitride, or titanium oxide; and
the first etching process uses a mixture of a fluorine-containing gas, an oxygen-containing gas, and an argon-containing gas.

7. The method of claim 1, further comprising performing an oxidation process to the spacer layer before performing the fourth etching process.

8. The method of claim 7, wherein the oxidation process is performed before performing the second etching process.

9. The method of claim 7, wherein the oxidation process is performed after performing the third etching process.

10. The method of claim 7, wherein the oxidation process is performed before performing the third etching process.

11. The method of claim 7, wherein the oxidation process is performed with oxygen plasma and a bias voltage of about 100 V to about 200 V.

12. A method comprising:
depositing a first dielectric layer over a substrate;
depositing a second dielectric layer over the first dielectric layer, wherein a material of the second dielectric layer is different than the first dielectric layer;
etching the second dielectric layer to form mandrel features having a first width;
depositing a third dielectric layer over the mandrel features and the first dielectric layer, wherein a material of the third dielectric layer is different than the material of the second dielectric layer;
etching and trimming the third dielectric layer to form spacers along sidewalls of the mandrel features, wherein the etching and trimming are separate steps that are configured to form first trenches between adjacent spacers, wherein the first trenches have a second width that is substantially the same as the first width;
etching the mandrel features to form second trenches having a third width between adjacent spacers, wherein the third width is substantially the same as the second width; and
etching the first dielectric layer and the substrate exposed by the first trenches and the second trenches.

13. The method of claim 12, further comprising:
after depositing the second dielectric layer, forming a resist pattern over the second dielectric layer, wherein the resist pattern defines a first pitch for resist features having a fourth width; and
etching the second dielectric layer using the resist pattern to form the mandrel features, wherein the mandrel features form a mandrel pattern having a second pitch, wherein the second pitch is substantially the same as the first pitch and the first width is substantially the same as the fourth width.

14. The method of claim 13, further comprising increasing a thickness of the second dielectric layer before performing the etching.

15. The method of claim 13, wherein the etching includes a first etching and a second etching, the method further comprising:
performing a first oxidation process before the first etching; and
performing a second oxidation process before the second etching.

16. The method of claim 13, wherein:
the etching the first dielectric layer uses the etched and trimmed second dielectric layer as an etching mask; and
the etching the substrate uses the etched first dielectric layer as an etching mask.

17. The method of claim 13, wherein:
the first dielectric layer includes silicon and oxygen;
the second dielectric layer includes polysilicon; and
the third dielectric layer includes silicon and nitrogen.

18. A method comprising:
forming a patterned polysilicon layer over a gate layer, wherein the patterned polysilicon layer includes polysilicon features that define a gate pattern having a pitch, wherein each of the polysilicon features has a width corresponding with a desired gate length;
depositing a dielectric layer over the patterned polysilicon layer, wherein the dielectric layer is disposed along sidewalls of the polysilicon features;
performing a first etching process to partially remove the dielectric layer to expose a portion of the polysilicon features, wherein the first etching process is configured to avoid etching of the polysilicon features, and further wherein a thickness of the dielectric layer is increased by an oxidation process before performing the first etching process;

performing a second etching process to partially remove the dielectric layer and adjust spacing between adjacent sidewalls of the dielectric layer, such that the spacing is substantially equal to the width of the polysilicon features, wherein the second etching process is configured to avoid etching of the polysilicon features;

after performing the first etching process and the second etching process, performing a third etching process to completely remove the polysilicon features, wherein the third etching process is configured to avoid etching of the dielectric layer; and patterning the gate layer using a pattern defined by a remaining portion of the dielectric layer.

19. The method of claim 18, wherein the first etching process includes a first etching step and a second etching step, and the oxidation process includes a first oxidation step and a second oxidation step, such that a thickness of the dielectric layer is increased by the first oxidation step before the first etch step and the second oxidation step before the second etch step.

20. The method of claim 18, wherein the patterning the gate layer includes forming polysilicon gate electrodes or forming dummy gate electrodes for use in a gate replacement process.

* * * * *